(12) United States Patent
Pan

(10) Patent No.: US 7,940,078 B2
(45) Date of Patent: *May 10, 2011

(54) METHOD AND APPARATUS FOR OUTPUT DRIVER CALIBRATION, AND MEMORY DEVICES AND SYSTEM EMBODYING SAME

(75) Inventor: Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/498,949

(22) Filed: Jul. 7, 2009

(65) Prior Publication Data

US 2009/0267642 A1    Oct. 29, 2009

Related U.S. Application Data

(63) Continuation of application No. 11/511,543, filed on Aug. 29, 2006, now Pat. No. 7,557,603.

(51) Int. Cl.
*H03K 17/16* (2006.01)
*H03K 19/003* (2006.01)
*G11C 7/00* (2006.01)

(52) U.S. Cl. ........................ 326/30; 327/108; 365/189.11
(58) Field of Classification Search .................... 326/30; 327/333
See application file for complete search history.

(56) References Cited

U.S. PATENT DOCUMENTS

| | | | |
|---|---|---|---|
| 6,055,848 A * | 5/2000 | Weigold ........................ | 73/31.05 |
| 6,262,625 B1 | 7/2001 | Perner et al. | |
| 6,762,620 B2 | 7/2004 | Jang et al. | |
| 6,807,650 B2 | 10/2004 | Lamb et al. | |
| 6,947,336 B2 | 9/2005 | Kim et al. | |
| 6,958,613 B2 | 10/2005 | Braun et al. | |
| 7,557,603 B2 * | 7/2009 | Pan ............................... | 326/30 |
| 2002/0063576 A1 | 5/2002 | Kim et al. | |
| 2003/0218914 A1 | 11/2003 | Kim et al. | |
| 2004/0021481 A1 | 2/2004 | Ohno | |
| 2007/0263459 A1 * | 11/2007 | Kim et al. ................. | 365/189.11 |

* cited by examiner

*Primary Examiner* — Vibol Tan
*Assistant Examiner* — Dylan White
(74) *Attorney, Agent, or Firm* — TraskBritt

(57) ABSTRACT

A method, system, and output driver calibration circuit determine calibration values for configuring adjustable impedance output drivers. The calibration circuit includes a pull-up calibration circuit configured to generate an averaged pull-up count signal for calibrating p-channel devices in the output driver with the averaged pull-up count signal being an average of a plurality of pull-up count signals. The calibration circuit further includes a pull-down calibration circuit configured to generate an averaged pull-down count signal for calibrating n-channel devices in the output driver with the averaged pull-down count signal being an average of a plurality of pull-down count signals.

20 Claims, 6 Drawing Sheets

US 7,940,078 B2

METHOD AND APPARATUS FOR OUTPUT DRIVER CALIBRATION, AND MEMORY DEVICES AND SYSTEM EMBODYING SAME

CROSS-REFERENCE TO RELATED APPLICATION

This application is a continuation of application Ser. No. 11/511,543, filed Aug. 29, 2006, now U.S. Pat. No. 7,557,603, issued Jul. 7, 2009.

BACKGROUND OF THE INVENTION

1. Field of the Invention

Embodiments of the present invention are directed generally to semiconductor devices and, more particularly, to memory devices which include high-resolution trimable output drivers.

2. State of the Art

Semiconductor devices such as microcomputers, memories, gate arrays, among others, include input/output pins and an output circuit for transmitting data to other devices along transmission lines formed on a board, and the like. A circuit within the semiconductor device that is responsible for transmitting data includes, for example, output buffers and drivers. For optimum transmission, the impedance of the transmitting device should be matched to the impedance of the transmission network and receiving device.

As operational speeds of electronic devices increase, the swing of transmitted signals decreases. However, as the signal swing width of a transmitted signal decreases, external noise increases. External noise can affect the reflection characteristics of an output signal if there is any impedance mismatch at an interface. Impedance mismatches may be caused by external noise, noise on a supply voltage, temperature and process variations, as well as other variations. If an impedance mismatch arises, the transmission speed of the data decreases, and the data from a semiconductor device may become distorted. Thus, in a case where a semiconductor device receives distorted data, problems can be caused by setup/hold failures or errors in reading received data.

Integrated circuits typically include a number of input/output terminals or pins, which are used for communication with additional circuitry. For example, an integrated memory device, such as a dynamic random access memory (DRAM), includes both control inputs for receiving memory operation control signals, and data pins for bidirectional data communication with an external system or processor. The data transmission rate of conventional integrated circuits is primarily limited by internal circuitry operating speeds. That is, communication networks have been developed that can transmit signals between circuitry at a rate that is faster than the capacity of many integrated circuits.

To address the need for faster circuits, a group of integrated circuits can be combined on a common bus. In this configuration, each integrated circuit operates in a coordinated manner with the other integrated circuits to share data that is transmitted at a high speed. For example, a group of memory devices, such as DRAMs, static RAMs, or read only memories (ROM), can be connected to a common data bus. The data rate of the bus may be substantially faster than the feasible operating speed of the individual memories. Each memory, therefore, is operated so that while one memory is processing received data, another memory is receiving new data. By providing an appropriate number of memory devices and an efficient control system, very high-speed data transmissions can be achieved.

In order to reduce the effects of impedance mismatches, techniques for more tightly matching the output driver impedance with the characteristic impedance of the remaining circuit within which the output driver interacts are desirable. Manufacturing process control during fabrication of the integrated circuit that includes an output driver is one method for controlling the output impedance of the output driver. However, as transmission data rates increase, impedance matching of the output driver to the characteristic impedance using conventional processing controls is inadequate.

For the reasons stated above, and for other reasons stated below, which will become apparent to those skilled in the art upon reading and understanding the present specification, there is a need in the art for a high-speed output driver circuit wherein the impedance may be more precisely adjusted.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

Figure 1:
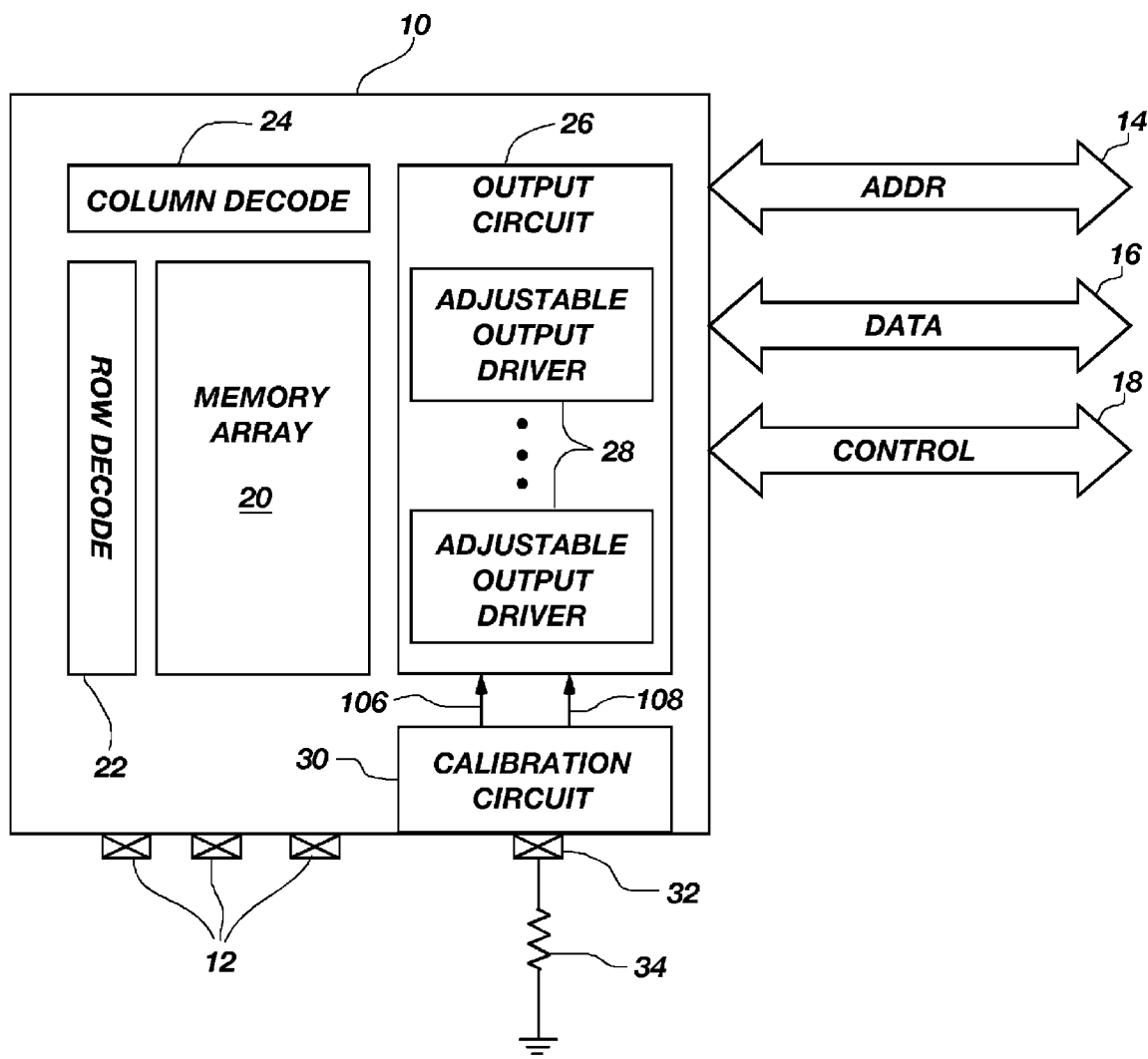
FIG. 1 is a block diagram of a memory device including an output driver calibration circuit, in accordance with an embodiment of the present invention.

A calibration circuit, adjustable output driver, system and method for calibrating an impedance of an adjustable output driver are disclosed. In one embodiment of the present invention, an output driver calibration circuit includes a pull-up calibration circuit including a first comparator configured to compare a reference voltage to a first voltage at a calibration terminal when an external load is connected thereto. The pull-up calibration circuit generates a first averaged count signal by averaging a plurality of first count signals from a first counter responsive to an output of the first comparator and in response to a respective plurality of input configurations on the first comparator. The calibration circuit further includes a pull-down calibration circuit including a second comparator configured to compare the reference voltage to a second voltage at a reference node. A second variable pull-up impedance circuit responds to the first averaged count signal and a variable pull-down impedance circuit is serially coupled at the reference node to the second variable pull-up impedance circuit. The pull-down calibration circuit generates a second averaged count signal by averaging a plurality of second count signals from the second counter in response to an output of the second comparator and in response to a respective plurality of input configurations.

In another embodiment of the present invention, a memory device includes a memory array, at least one adjustable output driver coupled between the memory array and at least one interface terminal, and an output driver calibration circuit configured to adjust an impedance of the at least one adjustable output driver. The output driver calibration circuit includes a pull-up calibration circuit including a first comparator configured to compare a plurality of input configurations of a reference voltage to a first voltage. The pull-up calibration circuit further includes a first counter configured to generate a respective plurality of first variable count signals in response to the plurality of input configurations and a first variable pull-up impedance circuit responsive to each of the plurality of first variable count signals. The pull-up calibration circuit further includes a first averaging circuit configured to generate a first averaged count signal from the plurality of first variable count signals. The output driver calibration circuit further includes a pull-down calibration circuit including a second variable pull-up impedance circuit responsive to the first averaged count signal and a variable pull-down impedance circuit serially coupled at a reference node to the second variable pull-up impedance circuit. A second comparator compares a plurality of input configurations of the reference voltage to a second voltage at the reference node and a second counter generates a respective plurality of second variable count signals in response to the plurality of input configurations. The pull-down calibration circuit further includes a second averaging circuit configured to generate a second averaged count signal from the plurality of second variable count signals.

In a further embodiment of the present invention, a semiconductor wafer is disclosed and comprises a plurality of integrated circuit memory devices with each memory device including a memory array, at least one adjustable output driver coupled between the memory array and at least one interface terminal, and an output driver calibration circuit configured to adjust an impedance of the at least one adjustable output driver.

In yet another embodiment of the present invention, an electronic system is disclosed that includes a processor, at least one of an input device and an output device operably coupled to the processor, and a memory device operably coupled to the processor. The memory device includes a memory array, and at least one adjustable output driver coupled between the memory array and at least one interface terminal. The memory device further includes an output driver calibration circuit configured to adjust an impedance of the at least one adjustable output driver.

In a yet further embodiment of the present invention, a method for calibrating an impedance of an adjustable output driver is disclosed. A first pull-up count signal is generated to drive a first variable pull-up impedance circuit in response to comparing a first configuration of a reference voltage to a first voltage generated between the first variable pull-up impedance circuit and a reference load. A second pull-up count signal is generated to drive the first variable pull-up impedance circuit in response to comparing a second configuration of the reference voltage to the first voltage generated between the first variable pull-up impedance circuit and the reference load. An averaged pull-up count signal for driving a pull-up impedance circuit of the adjustable output driver is generated by averaging the first and second pull-up count signals. A first pull-down count signal is generated to drive a variable pull-down impedance circuit in response to comparing a first configuration of a reference voltage to a second voltage generated between a second variable pull-up impedance circuit driven by the averaged pull-up count signal and the variable pull-down impedance circuit. A second pull-down count signal is generated to drive the variable pull-down impedance circuit in response to comparing a second configuration of a reference voltage to the second voltage generated between the second variable pull-up impedance circuit driven by the averaged pull-up count signal and the variable pull-down impedance circuit. An averaged pull-down count signal for driving a pull-down impedance circuit of the adjustable output driver is generated by averaging the first and second pull-down count signals.

In yet a further embodiment of the present invention, a calibration circuit for a variable impedance output driver is disclosed. The calibration circuit includes a pull-up calibration circuit configured to generate a p-channel count signal for calibrating p-channel devices in the variable impedance output driver, the p-channel count signal being an average of a plurality of count signals. The calibration circuit further includes a pull-down calibration circuit configured to generate an n-channel count signal for calibrating n-channel devices in the variable impedance output driver, the n-channel count signal being an average of a plurality of count signals.

One method and apparatus for improving the output impedance of an output driver on an integrated circuit includes the ability to trim or otherwise adjust the output impedance following the processing and fabrication of the integrated circuit. In the various embodiments of the present invention, the output impedance of the output driver is adjusted or trimmed, for example, by adjusting the quantity of p-channel and n-channel field effect transistors (FETs) that are engaged when an adjustable output driver is configured.

Trimming or adjusting the output driver may occur at various stages of integration including, but not limited to, packaging of the integrated circuit device and integration into a higher assembly circuit or system. Furthermore, the execution of the trim or adjustment may occur upon external request or activation or may be configured to be internally activated on one or more occurrences. In one application, the various embodiments of the present invention find application to one or more design standards that may include calibration commands including, but not limited to, self or internal calibration of output drivers.

FIG. 1 is a block diagram of a memory device including an output driver calibration circuit, in accordance with an embodiment of the present invention. A memory device 10 may be part of a DIMM (dual in-line memory module) or a PCB (printed circuit board) containing many such memory devices (not shown in FIG. 1). The memory device 10 may include a plurality of physical connection terminals or pins 12 located outside of memory device 10 for electrically connecting the memory device 10 into more integrated configurations such as memory modules or electronic systems. Various ones of pins 12 may couple to memory address bus 14, data (DQ) pins or data bus 16, and control pins or control bus 18. It is evident that each of the reference numerals 14, 16, 18 designates more than one pin in the corresponding bus. Further, it is understood that the diagram in FIG. 1 is for illustration only. That is, the pin arrangement or configuration in a typical memory device may not be in the form shown in FIG. 1.

In operation, a processor or memory controller (not shown) may communicate with the memory device 10 and perform memory read/write operations. The processor and the memory device 10 may communicate using address signals on the address bus 14, data signals on the data bus 16, and control signals (e.g., a row address strobe (RAS) signal, a column address strobe (CAS) signal, a chip select (CS) signal, etc. (not shown)) on the control bus 18. The "width" (i.e., number of pins) of address, data and control buses may differ from one memory configuration to another.

The memory device 10 may include a plurality of memory cells in a memory array 20 generally arranged in an array of rows and columns. A row decode circuit 22 and a column decode circuit 24 may select the rows and columns, respectively, in the memory array 20 in response to decoding an address provided on the address bus 14. Data to and from the memory cells of memory array 20 are then transferred over the data bus 16 via sense amplifiers (not shown) and a data output path (not shown). A memory controller (not shown) may provide relevant control signals (not shown) on the control bus 18 to control data communication to and from the memory device 10 via an Input/Output (I/O) circuit, the output portion of which is illustrated as output circuit 26. The output circuit 26 may include a number of data output buffers or output drivers to receive the data bits from the memory array 20 and to provide those data bits or data signals to the corresponding data lines in the data bus 16. In accordance with the various embodiments of the present invention, the output drivers are illustrated as adjustable output drivers 28.

The memory device 10 also includes an output driver calibration circuit 30 constructed according to the various embodiments of the present invention. The output driver calibration circuit 30 further includes a calibration terminal or pad 32 utilized for trimming or adjusting the output impedance of the adjustable output drivers 28 of the output circuit 26. An external load such as an external calibration resistor 34 is connectable to the calibration terminal or pad 32 and is used to control the output impedance of the memory device 10 as described below.

Those of ordinary skill in the art will readily recognize that memory device 10 of FIG. 1 is simplified to illustrate one embodiment of a memory device. FIG. 1 is not intended to be a detailed illustration of all of the elements and features of a typical memory device and various elements of a memory device are not illustrated for clarity in understanding the various embodiments of the present invention.

Figure 2:
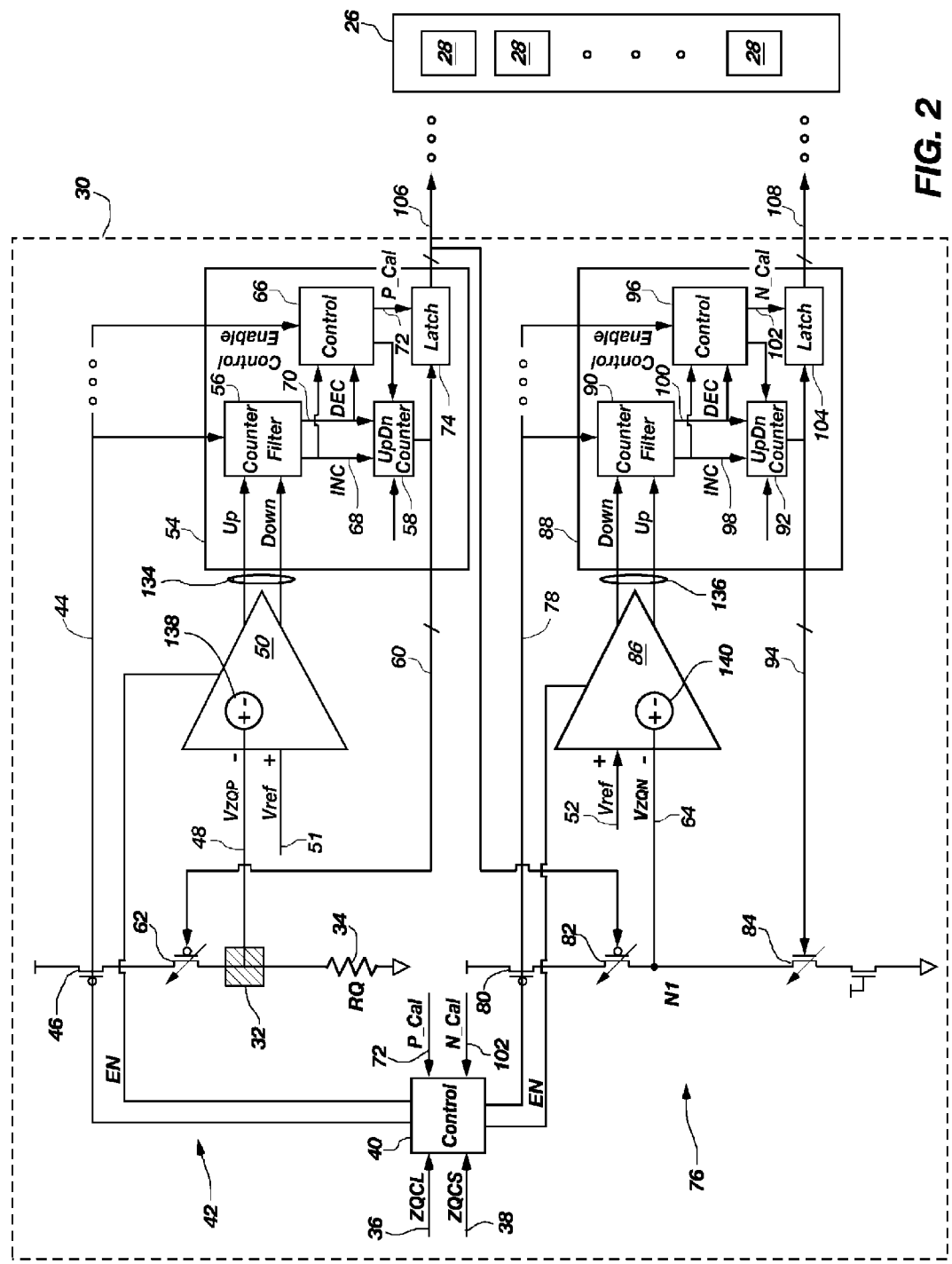
FIG. 2 is block diagram of an output driver calibration circuit, in accordance with an embodiment of the present invention.

FIG. 2 is a block diagram of an output driver calibration circuit, in accordance with an embodiment of the present invention. The output driver calibration circuit 30 is configured to provide output driver impedance control for obtaining a desired output impedance value irrespective of power supply voltage, temperature, and process variations. The various embodiments of the present invention describe an adjustable output driver circuit having a pull-up circuit or section comprised of pull-up transistors, and a pull-down circuit or section comprised of pull-down transistors. The adjustable output drivers 28 are configurable according to the calibration results of the output driver calibration circuit 30 when an external calibration resistor 34 is coupled to the calibration terminal or pad 32.

In FIG. 2, output driver calibration circuit 30 includes a calibration terminal or pad 32 to which the external calibration resistor 34 may be connected. In order to perform the output driver calibration method of one or more embodiments of the present invention, the external calibration resistor 34 is attached to calibration terminal or pad 32 to identify to the output driver calibration circuit 30 the target or desired output driver impedance. In one embodiment of the present invention, a calibration command is received at the memory device 10 (FIG. 1) and is decoded into one or more specific calibration sequences. In FIG. 2, by way of illustration and not limitation, the calibration command may be a long calibration command ZQCL 36 or a short calibration command ZQCS 38 that directs calibration and control logic 40 to sequence the output driver calibration method.

In response to a calibration command, the p-channel or pull-up calibration circuit portion 42 of the output driver calibration circuit 30 is activated to determine the pull-up configuration of the adjustable output driver 28 that best approximates the desired output driver impedance. A p-channel calibration enable signal 44 activates p-channel FET 46 and enables or resets other elements within a pull-up calibration circuit portion 42 of the output driver calibration circuit 30. The value of voltage $V_{ZQP}$ 48 at the calibration terminal or pad 32 is input to a comparator 50 along with a reference voltage $V_{REF}$ 51 produced by a reference generator (not shown).

Comparator 50 compares the voltage $V_{ZQP}$ 48 of a resistor divider to the reference voltage $V_{REF}$ 51 (usually VCC/2). The comparator 50 may be of various types that produce up and down pulses 134 in response to the difference in magnitude between the values of reference voltage $V_{REF}$ 51 and the voltage $V_{ZQP}$ 48. The up and down pulses 134 from comparator 50 are coupled to a p-channel calibration logic 54 which includes a counter filter 56 for accumulating and filtering the up and down pulses 134 prior to being input into an up-down counter 58 as increment (INC) 68 and (DEC) 70 pulses. The up-down counter 58 produces a multi-bit, variable p-channel count signal 60 representing a count value that is responsive to the number of up and down pulses 134 that have been counted. The p-channel count signal 60 is input to a pull-up or p-channel variable impedance circuit 62. The variable impedance circuit 62 is shown in detail in FIG. 3A.

Figure 3A:
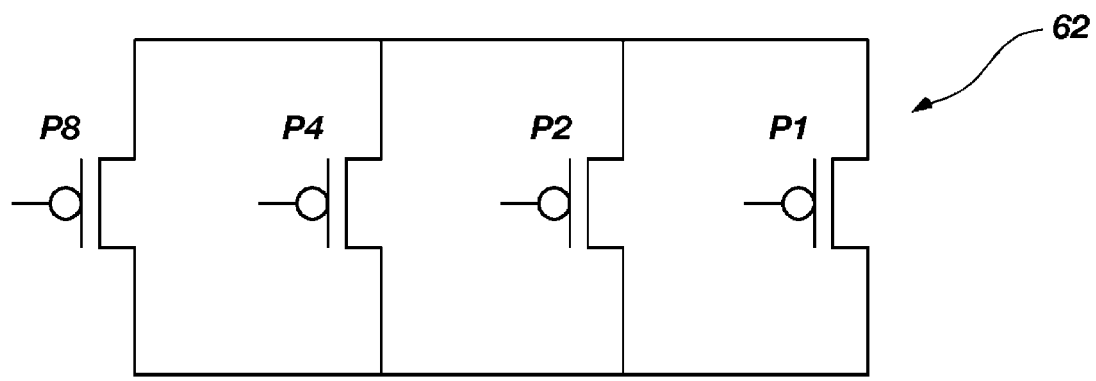
FIGS. 3A and 3B are examples of pull-up and pull-down variable impedance circuits, in accordance with an embodiment of the present invention.

By way of example and not limitation, the variable impedance circuit 62 in FIG. 3A is comprised of four p-channel FETs arranged in a parallel configuration. The gate of each of the FETs is controlled by one of the bits of the variable p-channel count signal 60 from up-down counter 58 (FIG. 2). Furthermore, each FET is configured as being, for example, twice the size, i.e., has twice the drive of a previous FET. Thus, FET P2 is twice the size of FET P1, FET P4 is twice the size of FET P2, and FET P8 is twice the size of FET P4.

Returning to FIG. 2, after the value for the variable p-channel count signal 60 has been locked by latch 74 in response to a pull-up calibration complete signal P-Cal 72 from control 66, a similar process is carried out for an n-channel or pull-down calibration circuit portion 76. The n-channel or pull-down calibration circuit portion 76 of the output driver calibration circuit 30 is activated to determine the pull-down configuration of the adjustable output driver 28 that best approximates the desired output driver impedance. An n-channel calibration enable signal 78 activates n-channel FET 80 and enables or resets other elements within a pull-down portion 76 of the output driver calibration circuit 30. The value of the voltage $V_{ZQN}$ 64 is set from latched output driver calibrated p-channel count signal 106 controlling pull-up or p-channel variable impedance circuit 82 and variable settings to a variable impedance circuit 84. The voltage $V_{ZQN}$ 64 is input to a comparator 86 along with a reference voltage $V_{REF}$ 52 produced by a reference generator (not shown).

Comparator 86 compares the voltage $V_{ZQN}$ 64 of the resistor divider to a reference voltage $V_{REF}$ 52 (usually VCC/2). The comparator 86 may be of various types that produce up and down pulses in response to the difference in magnitude between the values of reference voltage $V_{REF}$ 52 and the voltage $V_{ZQN}$ 64. The up and down pulses 136 from comparator 86 are coupled to an n-channel calibration logic 88 which includes a counter filter 90 for accumulating and filtering the up and down pulses 136 prior to being input into an up-down counter 92 as increment (INC) 98 and decrement (DEC) 100 pulses. The up-down counter 92 produces a multi-bit, variable n-channel count signal 94 representing a count value that is responsive to the number of up and down pulses 136 that have been counted. The value for the variable n-channel count signal 94 has been locked by latch 104 in response to a pull-down calibration complete signal N-Cal 102 from control 96. The variable n-channel count signal 94 is input to a pull-down or n-channel variable impedance circuit 84. The variable impedance circuit 84 is shown in detail in FIG. 3B.

Figure 3B:
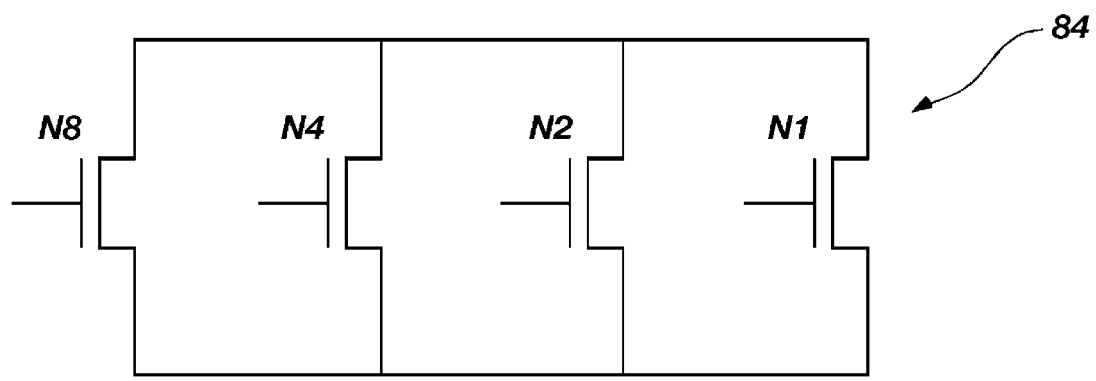

By way of example and not limitation, the variable impedance circuit 84 in FIG. 3B is comprised of four n-channel FETs arranged in a parallel configuration. The gate of each of the FETs is controlled by one of the bits of the variable n-channel count signal 94 (FIG. 2) from up-down counter 92. Furthermore, each FET is configured as being, for example, twice the size, i.e., has twice the drive of a previous FET. Thus, FET N2 is twice the size of FET N1, FET N4 is twice the size of FET N2, and FET N8 is twice the size of FET N4.

Figure 4:
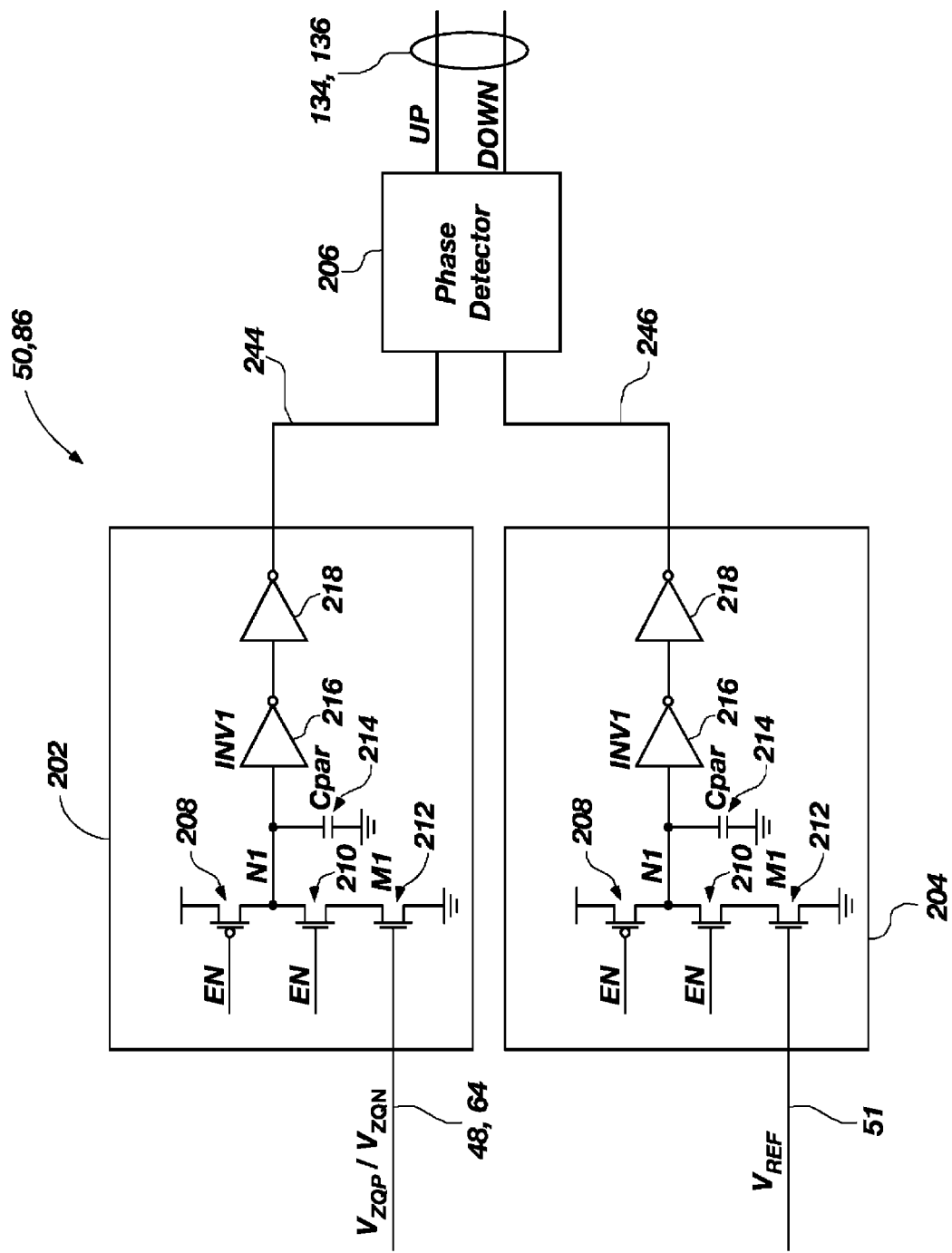
FIG. 4 is a block diagram of a voltage-to-time comparator, in accordance with an embodiment of the present invention.

FIG. 4 illustrates a block diagram of a comparator, in accordance with an embodiment of the present invention. By way of example and not limitation, one representative type of comparator converts each of the voltage input signals into a time signal with the respective time signals being phase-compared to determine a difference. Such a voltage-to-time comparator implementation results in improved speed operation and also results in a self-timing implementation of a comparator function. Specifically, comparators 50, 86 include a measured voltage-to-time converter 202 for converting a measured voltage, voltage $V_{ZQP}$ 48 for comparator 50 and voltage $V_{ZQN}$ 64 for comparator 86, into a measured time signal 244. Comparator 50, 86 further includes a reference voltage-to-time converter 204 for converting a reference voltage, reference voltage $V_{REF}$ 51 for comparator 50 and reference voltage $V_{REF}$ 52 for comparator 86, into a reference time signal 246. Measured time signal 244 and reference time signal 246 are coupled to a phase detector 206 for generating the up and down pulses 134 for comparator 50 and up and down pulses 136 for comparator 86.

Voltage-to-time converters 202, 204 include pull-up transistors 208 and pull-down transistors 210 responsive to an enable signal EN from calibration and control logic 40 (FIG. 2). The voltage-to-time converter 202 further includes a pull-down transistor M1 212 that is controlled by voltage $V_{ZQP}$ 48 in comparator 50 and $V_{ZQN}$ 64 in comparator 86. The voltage-to-time converter 204 further includes a pull-down transistor M1 212 that is controlled by reference voltage $V_{REF}$ 51 in comparator 50 and reference voltage $V_{ref}$ 52 in comparator 86. A parasitic capacitance $C_{PAR}$ 214 forms an RC time constant signal that is converted to a digital signal using inverters 216 and 218 to generate the measured time signal 244 for measured voltage-to-time converter 202 and reference time signal 246 for reference voltage-to-time converter 204.

While comparator 50, 86 operates adequately for moderate speed memory devices, the comparator may include an inherent offset of several tens of millivolts. Generally, comparator offsets, illustrated in FIG. 2 as offset voltages 138, 140, result from processing variations such as mismatches between pull-down transistor M1 212 of measured voltage-to-time converter 202 and pull-down transistor M1 212 of reference voltage-to-time converter 204 of comparators 50, 86. While such comparator offset voltages result from mismatches between pull-down transistors M1 212, parasitic capacitance $C_{PAR}$ 214, and inverter 216, 218 mismatches, the cumulative effect of such mismatches, assuming external calibration resistor 34 equals 240 ohms and worst case processing parameter processing corners (e.g., $VCC_{MAX}$, high temp max, etc.), offset voltages on the order of 50 millivolts may be typical.

Various memory devices that may include comparators 50, 86 may be subject to various standards that impose operational tolerances on the respective memory devices. One such performance standards body includes the Joint Electron Device Engineering Council (JEDEC), which imposes a requirement that DDR3 memory devices exhibit an output impedance varying by less than 10% across all output voltage curves. For output impedance calibration methods that perform an initial calibration of the pull-up impedance followed by a calibration of the pull-down impedance, a calibration of an approximate accuracy of +/−3% is needed for both the pull-up and pull-down calibration processes. Such an accuracy results in an approximate maximum offset voltage, $V_{offset}$, of about 10 millivolts between the pull-up and pull-down comparators.

Figure 5:
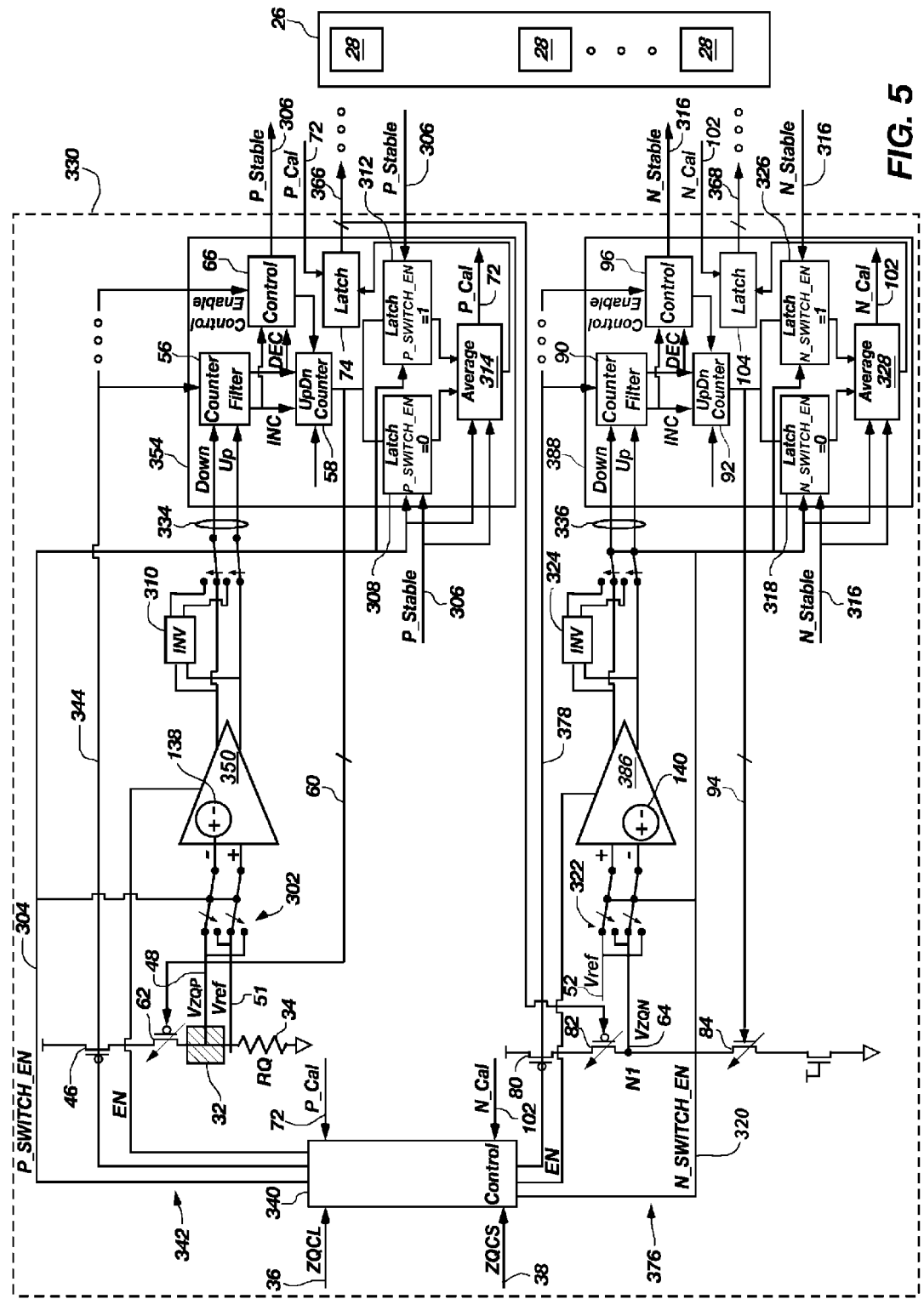
FIG. 5 is a block diagram of an output driver calibration circuit, in accordance with yet another embodiment of the present invention.

FIG. 5 is a block diagram of an output driver calibration circuit, in accordance with another embodiment of the present invention. The output driver calibration circuit 330 is configured to provide output driver impedance control for obtaining a desired output impedance value irrespective of power supply voltage, temperature, and process variations. The present embodiment provides calibration of output drivers by reducing the effect of offsets introduced by comparator mismatches. The present embodiment of the present invention describes an adjustable output driver circuit having a pull-up circuit or section comprised of pull-up transistors, and a pull-down circuit or section comprised of pull-down transistors. The adjustable output drivers are configurable according to the calibration results of the output driver calibration circuit 330 when an external calibration resistor 34 is coupled to the calibration terminal or pad 32.

In the present embodiment, a set of inputs is connected to a comparator in a first orientation followed by a first determination of a corresponding first count signal that could be used to configure the output drivers. The set of inputs is then connected to the comparator in a second orientation followed by a second determination of a corresponding second count signal that could also be used to configure the output drivers. The first and second count signals are then averaged to reduce the offset error due to mismatches in the comparator circuits. The averaged count signal is then used to configure the output drivers. This averaging process may be used on one or both of the pull-up and pull-down portions of the calibration circuit.

In FIG. 5, output driver calibration circuit 330 includes a calibration terminal or pad 32 to which an external calibration resistor 34 may be connected. In order to perform the output driver calibration method of the present embodiment of the present invention, the external calibration resistor 34 is attached to calibration terminal or pad 32 to identify to the output driver calibration circuit 330 the target or desired output driver impedance. In one embodiment of the present invention, a calibration command is received at the memory device 10 (FIG. 1) and is decoded into one or more specific calibration sequences. In FIG. 5, by way of illustration and not limitation, the calibration command may be a long calibration command ZQCL 36 or a short calibration command ZQCS 38 that directs calibration and control logic 340 to sequence the output driver calibration method.

In response to a calibration command, the p-channel or pull-up calibration circuit portion 342 of the output driver calibration circuit 330 is activated to determine the pull-up configuration of the adjustable output driver that best approximates the desired output driver impedance. A p-channel calibration enable signal 344 activates p-channel FET 46 and enables or resets other elements within a pull-up calibration circuit portion 342 of the output driver calibration circuit 330. A comparator input switch 302 is controlled by a P_SWITCH_EN control signal 304 as generated by calibration and control logic 340. In the first input signal orientation, the value of the voltage $V_{ZQP}$ 48 at the calibration terminal or pad 32 is input to a comparator 350 along with a reference voltage $V_{REF}$ 51 produced by a reference generator (not shown).

Comparator 350 compares the voltage $V_{ZQP}$ 48 of the resistor divider to a reference voltage $V_{REF}$ 51 (usually VCC/2). The comparator 350 produces up and down pulses in response to the difference in magnitude between the values of reference voltage $V_{REF}$ 51 and the voltage $V_{ZQP}$ 48. The up and down pulses 334 from comparator 350 are coupled to a p-channel calibration logic 354, which includes a counter filter 56 for accumulating and filtering the up and down pulses 334 prior to being input into an up-down counter 58. The up-down counter 58 produces a multi-bit, variable p-channel count signal 60 representing a count value that is responsive to the number of up and down pulses 334 that have been counted. The p-channel count signal 60 is input to a pull-up or p-channel variable impedance circuit 62. The variable impedance circuit 62 is shown in detail in FIG. 3A.

After the first value for the variable p-channel count signal 60 has been stabilized as indicated by P_STABLE signal 306, the first value for the variable p-channel count signal 60 (Pcal_1<0:3> for a four bit bus) is stored in latch 308. Control logic 340 toggles P_SWITCH_EN signal 304 causing comparator input switch 302 to reverse the connection of the inputs to comparator 350. P_SWITCH_EN signal 304 also switches the outputs of comparator 350 to pass through an inverter 310 to cancel out the reversed polarity of the signals on the inputs of comparator 350.

Comparator 350 then again compares the voltage $V_{ZQP}$ 48 of the measured resistor divider to a reference voltage (usually VCC/2). The comparator 350 produces up and down pulses in response to the difference in magnitude between the values of reference voltage $V_{REF}$ 51 and the voltage $V_{ZQP}$ 48. The up and down pulses 334 from comparator 350 are again coupled to the p-channel calibration logic 354. The up-down counter 58 produces a second multi-bit, variable p-channel count signal 60 representing a second count value that is responsive to the number of up and down pulses 334 that have been counted. The second p-channel count signal 60 is input to a pull-up or p-channel variable impedance circuit 62. The variable impedance circuit 62 is shown in detail in FIG. 3A.

After the second value for the variable p-channel count signal 60 has been stabilized as indicated by P STABLE signal 306, the second value for the variable p-channel count signal 60 (Pcal_2<0:3> for a four bit bus) is stored in latch 312. When both the first and second variable p-channel count signals are determined, an averaging circuit 314 averages the first and second variable p-channel count signals to generate an averaged variable p-channel count signal that is locked by latch 74 in response to a pull-up calibration complete signal P-Cal 72.

After the value for the averaged variable p-channel count signal 60 has been locked, a similar process is carried out for an n-channel or pull-down calibration circuit portion 376. The n-channel or pull-down calibration circuit portion 376 of the output driver calibration circuit 330 is activated to determine the pull-down configuration of the adjustable output driver that best approximates the desired output driver impedance. An n-channel calibration enable signal 378 activates n-channel FET 80 and enables or resets other elements within a pull-down calibration circuit portion 376 of the output driver calibration circuit 330. The value of the voltage $V_{ZQN}$ 64 is set from latched output driver calibrated p-channel count signal 366 controlling pull-up or p-channel variable impedance circuit 82 and variable settings to a variable impedance circuit 84. The voltage $V_{ZQN}$ 64 is input to a comparator 386 along with a reference voltage $V_{REF}$ 52 produced by a reference generator (not shown).

Comparator 386 compares the voltage $V_{ZQN}$ 64 of the resistor divider to the reference voltage $V_{REF}$ 52 (usually VCC/2). The comparator 386 produces up and down pulses in response to the difference in magnitude between the values of reference voltage $V_{REF}$ 52 and the voltage $V_{ZQN}$ 64. The up and down pulses 336 from comparator 386 are coupled to a n-channel calibration logic 388, which includes a counter filter 90 for accumulating and filtering the up and down pulses 336 prior to being input into an up-down counter 92. The up-down counter 92 produces a multi-bit, variable n-channel count signal 94 representing a count value that is responsive to the number of up and down pulses 336 that have been counted. The variable n-channel count signal 94 is input to a pull-down or n-channel variable impedance circuit 84. The variable impedance circuit 84 is shown in detail in FIG. 3B.

After the first value for the variable n-channel count signal 94 has been stabilized as indicated by N_STABLE signal 316, the first value for the variable n-channel count signal 94 (Ncal_1<0:3> for a four bit bus) is stored in latch 318. Calibration and control logic 340 toggles N_SWITCH_EN signal 320 causing comparator input switch 322 to reverse the connection of the inputs to comparator 386. N_SWITCH_EN signal 320 also switches the outputs of comparator 386 to pass through an inverter 324 to cancel out the reversed polarity of the signals on the inputs of comparator 386.

Comparator 386 then again compares the voltage $V_{ZQN}$ 64 of the resistor divider to the reference voltage $V_{REF}$ 52 (usually VCC/2). The comparator 386 produces up and down pulses in response to the difference in magnitude between the values of reference voltage $V_{REF}$ 52 and the voltage $V_{ZQN}$ 64. The up and down pulses 336 from comparator 386 are again coupled to the n-channel calibration logic 388. The up-down counter 92 produces a second multi-bit, variable n-channel count signal 94 representing a second count value that is responsive to the number of up and down pulses 336 that have been counted. The second n-channel count signal 94 is input to a pull-down or n-channel variable impedance circuit 84. The variable impedance circuit 84 is shown in detail in FIG. 3B.

After the second value for the variable n-channel count signal 94 has been stabilized as indicated by N_STABLE signal 316, the second value for the variable n-channel count signal 94 (Ncal_2<0:3> for a four bit bus) is stored in latch 326. When both the first and second variable n-channel count signals 94 are determined, an averaging circuit 328 averages the first and second variable n-channel count signals 94 to generate an averaged variable n-channel count signal 94 that is locked by latch 104 in response to a pull-down calibration complete signal N-Cal 102. Once the p-channel count signal 60 and the variable n-channel count signal 94 are latched by latch 74 and latch 104, respectively, the corresponding averaged channel count signals are output as output driver calibrated averaged p-channel count signal 366 (Pcal_average<0:3> for a four bit bus) and output driver calibrated averaged n-channel count signal 368. Output driver calibrated averaged p-channel count signal 366 and output driver calibrated averaged n-channel count signal 368 (Ncal_average<0:3> for a four bit bus) are then forwarded to output circuit 26 for specifically configuring each of the adjustable output drivers 28 to more closely correspond with the desired output impedance.

It is noted that if the comparators as described hereinabove include an offset mismatch, then the calibration error may be cancelled according to the embodiment described with reference to FIG. 5. For example, assume the comparator offset, $V_{offsetN}$, introduces a specific calibration error, calerror, with an offset, then Pcal__1<0:3>=Pcal_ideal<0:3>+calerror, and after inputs to the comparator is switched, Pcal__2<0:3>=Pcal_ideal<0:3>−calerror Averaging Pcal__1<0:3> and Pcal__2<0:3>, we get Pcal_average<0:3>=(Pcal__1<0:3>+Pcal__2<0:3>)/2= Pcal_ideal<0:3>.

TABLE 1

Illustrates exemplary calculations for a calibration resistor of 240 ohms.

| Pcal <0:3> | Pull Up device resistor (ohm) | resistor divider output voltage | voltage difference between resistor divider and $V_{ref}$(VCC/2) |
|---|---|---|---|
| 6 | 208 | 0.804 | 0.054 |
| 7 | 218 | 0.786 | 0.036 |
| 8 | 228 | 0.769 | 0.019 |
| 9 | 238 | 0.753 | 0.003 |
| 10 | 248 | 0.738 | −0.012 |
| 11 | 258 | 0.723 | −0.027 |
| 12 | 268 | 0.709 | −0.041 |
| 13 | 278 | 0.695 | −0.055 |

In Table 1, different Pcal<0:3> values indicate different representative pull-up resistor values. When combined with a 240 ohm external resistor of the present example, the calibration circuit generates the voltage difference between the resistor divider output and $V_{ref}$. In an ideal case from Table 1, the final Pcal<0:3> value will be a value of "9" or "10" as generated from the representative four bit value. Both values "9" and "10" are possible depending upon the specific operation of the counter. If the comparator includes an inherent 50 millivolts offset voltage, the calibrated variable p-channel count signal 60 (Pcal<0:3>) could as much as 50 millivolts away from a "9" or "10" count, which includes counts of "6/7" to "12/13" in the representative present example of Table 1. Such a deviation represents about a 10% to 15% resistor error from the ideal value of 240 ohms.

Therefore, in the present example, if the averaging embodiment of FIG. 5 is utilized, the output driver calibrated averaged p-channel count signal 366 (Pcal_average<0:3>) is calculated as either:

(i) ("6"+"13")/2="9", or
(ii) ("6"+"14")/2="9", or
(iii) ("7"+"13")/2="9", or
(iv) ("7"+"14")/2="10".

As illustrated in the present example, the averaging embodiment of FIG. 5 results in a calculation of a count signal that is the same as the ideal count.

Figure 6:
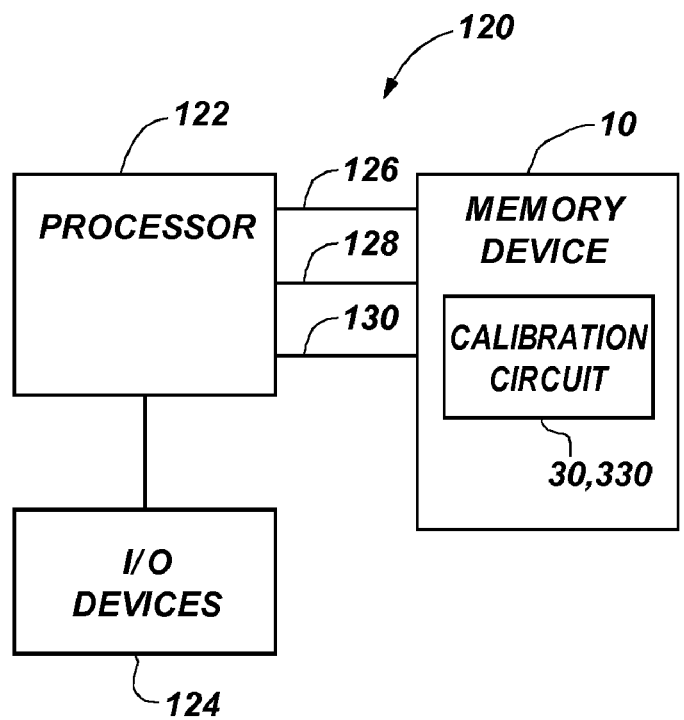
FIG. 6 is a block diagram of an electronic system including a memory device further including an output driver calibration circuit, in accordance with an embodiment of the present invention.

FIG. 6 is a block diagram of an electronic system including a memory device further including a calibration circuit, in accordance with an embodiment of the present invention. Electronic system 120 includes a processor 122, a memory device 10, and one or more I/O devices 124. Processor 122 may be a microprocessor, digital signal processor, embedded processor, microcontroller, or the like. Processor 122 and memory device 10 communicate using address signals on lines 126, control signals on lines 128, and data signals on lines 130. Memory device 10 includes an output driver calibration circuit 30, 330 for use in generation of output driver calibrated p-channel and n-channel count signals 106, 108 (FIG. 2) and output driver calibrated averaged p-channel and n-channel count signals 366, 368 (FIG. 5).

Figure 7:
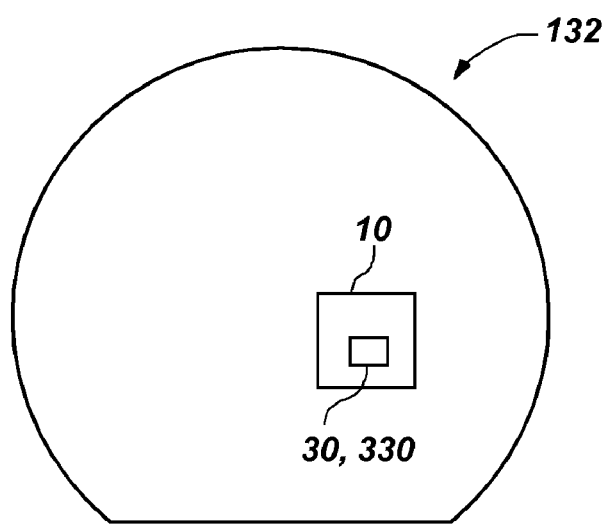
FIG. 7 illustrates a semiconductor wafer including one or more devices that further include adjustable output drivers and an output driver calibration circuit, in accordance with an embodiment of the present invention.

FIG. 7 illustrates a semiconductor wafer including one or more memory devices that further include a reference generator, in accordance with an embodiment of the present invention. A wafer 132, which includes multiple integrated circuits such as a memory device 10, at least one of which incorporates an output driver calibration circuit 30, 330, in accordance with one or more embodiments of the present invention. In one embodiment, the wafer includes a semiconductor substrate, such as a silicon, germanium, gallium arsenide or indium phosphide wafer. After processing the substrate to form the various circuit elements of the memory device 10, and any other circuit elements included in the integrated circuit, each integrated circuit such as memory device 10 may be singulated into individual semiconductor dice, packaged, and incorporated into an electronic system.

Although the foregoing description contains many specifics, these should not be construed as limiting the scope of the present invention, but merely as providing illustrations of some exemplary embodiments. Similarly, other embodiments of the invention may be devised that do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims, are to be embraced thereby.

What is claimed is:

1. A memory device, comprising:
    an output circuit;
    a calibration connector configured to receive a first voltage when an external load is connected thereto;
    a first calibration circuit operably coupled between the output circuit and the calibration connector, wherein the first calibration circuit includes:
        a first comparator operably coupled with the calibration connector, wherein the first calibration circuit is configured to generate a first averaged count signal by averaging a first plurality of count signals generated by a first counter in response to a corresponding plurality of input and output configurations of the first comparator; and
        a first variable impedance circuit operably coupled to the calibration connector and the counter, wherein the first voltage is responsive to the first plurality of count signals; and
    a second calibration circuit operably coupled with the first calibration circuit and the output circuit, wherein the second calibration circuit includes a second comparator that is configured to receive an input of a second voltage responsive to the averaged count signal.

2. The memory device of claim 1, wherein the first comparator is configured to compare a reference voltage to the first voltage to generate a first plurality of up and down pulses on the output of the first comparator in response thereto.

3. The memory device of claim 2, wherein the second comparator is configured to compare the reference voltage to the second voltage at a reference node.

4. The memory device of claim 3, wherein the second calibration circuit is configured to generate a second averaged count signal by averaging a second plurality of count signals generated by a second counter in response to a respective plurality of input and output configurations the second comparator, wherein the second calibration circuit further comprises a second variable impedance circuit serially coupled at the reference node with a third variable impedance circuit, the second variable impedance circuit responsive to the first averaged count signal, and the third variable impedance circuit responsive to second plurality of count signals.

5. The memory device of claim 2, wherein the first comparator comprises a first voltage-to-time converter operably coupled with a first phase detector configured to generate the first plurality of up and down pulses, and wherein the second comparator comprises a second voltage-to-time converter operably coupled with a second phase detector to generate a second plurality of up and down pulses on the output of the second comparator.

6. The memory device of claim 1, wherein the first calibration circuit is configured as a pull-up calibration circuit and the second calibration circuit is configured as a pull-down calibration circuit.

7. The memory device of claim 1, wherein the first calibration circuit is configured as a pull-down calibration circuit and the second calibration circuit is configured as a pull-up calibration circuit.

8. The memory device of claim 1, wherein the calibration connector is selected from the group consisting of a calibration terminal, a calibration pin, and a calibration pad.

9. A memory device, comprising:
  an output circuit; and
  a calibration circuit configured to calibrate the output circuit, the calibration circuit comprising:
    a pull-up calibration circuit including a first comparator;
    a pull-down calibration circuit including a second comparator;
    a first comparator input switch for altering a plurality of input configurations to the first comparator to generate a plurality of first count signals; and
    a second comparator input switch for altering a plurality of input configurations to the second comparator to generate a plurality of second count signals.

10. The memory device of claim 9, further comprising:
  a first inverter switchably coupled to the output of the first comparator when one of the plurality of input configurations to the first comparator is reversed; and
  a second inverter switchably coupled to the output of the second comparator when one of the plurality of input configurations to the second comparator is reversed.

11. The memory device of claim 9, wherein the pull-up calibration circuit further comprises a first counter filter coupled between the first comparator and the first counter and configured to accumulate from the first comparator prior to generating a change to the first counter.

12. The memory device of claim 9, wherein the pull-up calibration circuit is further configured to generate a first stability signal responsive to a steady state of each of the plurality of input configurations to the first comparator.

13. The memory device of claim 12, further comprising a corresponding plurality of latches for storing each of the plurality of first count signals for averaging in the pull-up calibration circuit to generate the first averaged count signal.

14. The memory device of claim 9, wherein the pull-down calibration circuit further comprises a second counter filter coupled between the second comparator and the second counter and configured to accumulate from the second comparator prior to generating a change to the second counter.

15. The memory device of claim 9, wherein the pull-down calibration circuit is further configured to generate a second stability signal responsive to a steady state of each of the plurality of input configurations to the second comparator.

16. The memory device of claim 15, further comprising a corresponding plurality of latches for storing each of the plurality of second count signals for averaging in the pull-down calibration circuit to generate the second averaged count signal.

17. A method for calibrating an impedance of an adjustable output driver in a memory device, comprising:
  averaging first and second pull-up count signals driving a first variable pull-up impedance circuit in response to alternatingly comparing a reference voltage and a first voltage generated between the first variable pull-up impedance circuit and a reference load; and
  averaging first and second pull-down count signals driving a variable pull-down impedance circuit in response to alternatingly comparing a the reference voltage to a second voltage generated between a second variable pull-up impedance circuit driven by the averaged pull-up count signal and the variable pull-down impedance circuit.

18. The method of claim 17, wherein comparing comprises:
  converting from voltage signals to time signals; and
  detecting phase differences between the time signals.

19. The method of claim 17, further comprising generating the first and second pull-up count signals after the comparing of the first and second input configurations have reached a steady state.

20. The method of claim 17, further comprising generating the first and second pull-down count signals after the comparing of the first and second input configurations have reached a steady state.

* * * * *

UNITED STATES PATENT AND TRADEMARK OFFICE
CERTIFICATE OF CORRECTION

| | | |
|---|---|---|
| PATENT NO. | : 7,940,078 B2 | Page 1 of 1 |
| APPLICATION NO. | : 12/498949 | |
| DATED | : May 10, 2011 | |
| INVENTOR(S) | : Dong Pan | |

It is certified that error appears in the above-identified patent and that said Letters Patent is hereby corrected as shown below:

In column 1, line 9, delete "No.11/511,543," and insert -- No. 11/511,543, --, therefor.

In column 14, line 30, in Claim 17, delete "a the" and insert -- a --, therefor.

Signed and Sealed this
Fifth Day of July, 2011

David J. Kappos
*Director of the United States Patent and Trademark Office*